(12) United States Patent
Yoshida

(10) Patent No.: US 12,298,340 B2
(45) Date of Patent: May 13, 2025

(54) TESTING APPARATUS AND TESTING METHOD

(71) Applicant: FUJI ELECTRIC CO., LTD., Kawasaki (JP)

(72) Inventor: Mitsuru Yoshida, Shiojiri (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 91 days.

(21) Appl. No.: 18/453,946

(22) Filed: Aug. 22, 2023

(65) Prior Publication Data

US 2024/0142510 A1 May 2, 2024

(30) Foreign Application Priority Data

Oct. 27, 2022 (JP) .................. 2022-172478

(51) Int. Cl.
*G01R 31/26* (2020.01)

(52) U.S. Cl.
CPC ..... *G01R 31/2617* (2013.01); *G01R 31/2603* (2013.01); *G01R 31/2642* (2013.01)

(58) Field of Classification Search
CPC ............ G01R 31/2603; G01R 31/2617; G01R 31/2642; G01R 31/3277
See application file for complete search history.

(56) References Cited

U.S. PATENT DOCUMENTS

| | | | | |
|---|---|---|---|---|
| 11,519,955 B2* | 12/2022 | Graf | ................... | G01R 31/2608 |
| 2009/0102504 A1* | 4/2009 | Voigtlaender | ...... | G01R 31/2621 |
| | | | | 324/762.09 |
| 2013/0181723 A1* | 7/2013 | Mauder | ............. | G01R 19/0092 |
| | | | | 324/130 |
| 2017/0254842 A1* | 9/2017 | Bahl | .................. | G01R 31/2639 |

FOREIGN PATENT DOCUMENTS

JP 4821601 B2 11/2011
JP 2022-038486 A 3/2022

* cited by examiner

*Primary Examiner* — Thang X Le
(74) *Attorney, Agent, or Firm* — Rabin & Berdo, P.C.

(57) ABSTRACT

A testing apparatus, including: a variable resistor coupled to a control electrode of a switching device; a storage circuit storing information indicating a relation between a resistance value of the variable resistor and a voltage change rate at which a voltage between power-source-side and ground-side electrodes of the switching device changes when the switching device is turned off; and a control circuit controlling the variable resistor. The control circuit sets the variable resistor to have a first resistance value and obtains a first value of the voltage change rate, sets the variable resistor to have a second resistance value based on the first value of the voltage change rate and the information, obtains a second value of the voltage change rate when the variable resistor is of the second resistance value, and determines whether the second value of the voltage change rate meets a specification of the switching device.

14 Claims, 11 Drawing Sheets

TESTING APPARATUS AND TESTING METHOD

CROSS-REFERENCE TO RELATED APPLICATION

The present application claims priority pursuant to 35 U.S.C. § 119 from Japanese patent application number 2022-172478 filed on Oct. 27, 2022, the entire disclosure of which is hereby incorporated by reference herein.

BACKGROUND

Technical Field

The present disclosure relates to a testing apparatus and a testing method.

Description of the Related Art

For example, a turn-off switching test is performed on switching devices as a screening test to screen out initial failures and detective products (see, for example, Japanese Patent No. 4821601 and Japanese Patent Application Publication No. 2022-38486). A turn-off switching test is a test for screening out detective products and the like by damaging a detective portion in a switching device through current concentration or latch-up.

Usually, considering, e.g., variability between measurement environments and devices, stricter conditions (i.e., conditions giving excessive stress) than proper conditions are set for a turn-off switching test so that the performance may not fall below the lower-limit value required by the specifications. For this reason, there is a possibility of excessive breakage of switching devices.

SUMMARY

A first aspect of an embodiment of the present disclosure is a testing apparatus for testing a switching device that is series-coupled to an inductor, and that has a control electrode, a power-source-side electrode, and a ground-side electrode, a predetermined voltage being applied to the inductor, the testing apparatus comprising: a variable resistor coupled to the control electrode of the switching device; a storage circuit configured to store first information indicating a relation between a resistance value of the variable resistor and a voltage change rate which is a rate at which a voltage between the power-source-side electrode and the ground-side electrode of the switching device changes when the switching device is turned off; and a control circuit configured to control the variable resistor, and control on and off of the switching device, wherein the control circuit is configured to: set the resistance value of the variable resistor to a first resistance value and obtain a first value of the voltage change rate, set the resistance value of the variable resistor to a second resistance value smaller than the first resistance value based on the first value of voltage change rate and the first information, obtain a second value of the voltage change rate measured when the variable resistor is of the second resistance value, and determine whether the second value of the voltage change rate meets a first specification of the switching device.

A second aspect of an embodiment of the present disclosure is a testing method for testing a switching device that is series-coupled to an inductor, and has a control electrode, a power-source-side electrode, and a ground-side electrode, a predetermined voltage being applied to the inductor, the testing method comprising: setting a resistance value of the variable resistor coupled to a control electrode of the switching device to a first resistance value and obtaining a first value of a voltage change rate, the voltage change rate being a rate at which a voltage between the power-source-side electrode and the ground-side electrode of the switching device changes when the switching device is turned off, setting the resistance value of the variable resistor to a second resistance value smaller than the first resistance value based on the first value of the voltage change rate and first information indicating a relation between a resistance value of the variable resistor and the voltage change rate, obtaining a second value of the voltage change rate, when the variable resistor is of the second resistance value, and determining whether the second value of the voltage change rate meets a first specification of the switching device.

DETAILED DESCRIPTION

Figure 1:
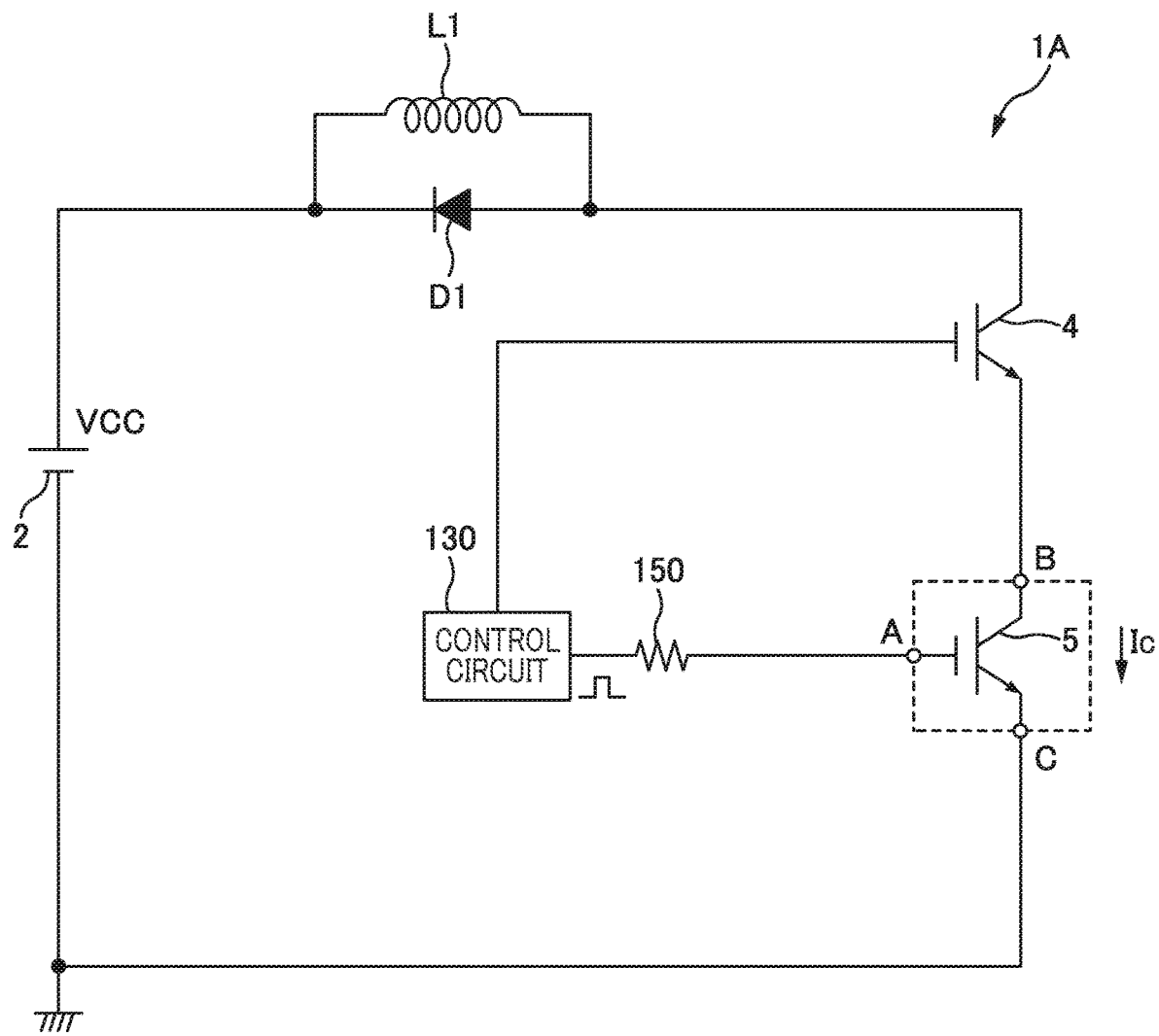
FIG. 1 is a diagram showing the configuration of a typical testing apparatus 1A.

At least following matters will become apparent from the descriptions of the present specification and the accompanying drawings.

Note that in the following, the same or like components, members, and the like shown in the drawings may be denoted by the same reference numerals to omit repetitive descriptions where appropriate.

Also, a term "couple" used in the present embodiment refers to electrical coupling unless otherwise noted. Thus, two components being "coupled" can refer not only to a state where they are coupled via wiring, but also to a state where they are coupled via, for example, a resistor.

Screening Test and Comparative Example

<<Screening Test>>

A large number of power semiconductor devices (hereinafter referred to as switching devices) such as power metal-oxide-semiconductor field-effect transistors (MOS- FETs) or insulated gate bipolar transistors (IGBTs) are formed on a wafer substrate. Then, these switching devices are divided by dicing and then incorporated into semiconductor modules.

A screening test is a test for evaluating whether a switching device operates properly and screening out initial failures or detective products (screening), and is usually performed before the switching device is incorporated into a semiconductor module. Screening tests include dynamic characteristics testing such as a turn-off switching test (hereinafter referred to as a turn-off SW test) and an L-load avalanche test and static characteristics testing such as an interelectrode leak current test and a static withstand voltage test. A turn-off SW test is described below.

<<Typical Testing Apparatus 1A>>

FIG. 1 is a diagram showing the configuration of a typical testing apparatus 1A.

The testing apparatus 1A is an apparatus that performs a screening test (here, a turn-off SW test) on a switching device 5. The testing apparatus 1A includes a power source 2 that supplies a power supply voltage VCC, a coil L1, a diode D1, a current blocking element 4, a control circuit 130, a resistor 150, and terminals A, B, C. The testing apparatus 1A also includes, e.g., a detection circuit (not shown) that detects an anomaly such as overcurrent by monitoring current values and voltage values during the test.

The coil L1 is a load (an inductive load) provided between the power source 2 and the switching device 5 to be described later, and the power supply voltage VCC of the power source 2 is applied to the coil L1.

The diode D1 is a diode for current regeneration and is provided in parallel with the coil L1.

The current blocking element 4 is an element for blocking the current supplied to the switching device 5 when an anomaly occurs and is provided between the coil L1 and the switching device 5 (or the terminal B to be more specific). Here, an IGBT is used as the current blocking element 4, and the gate electrode of the current blocking element 4 is coupled to the control circuit 130. Note that the current blocking element 4 is not limited to an IGBT and may be, for example, a MOSFET or a switch.

The control circuit 130 controls on and off of the current blocking element 4 and of the switching device 5. For example, the control circuit 130 applies a drive signal to the gate electrode of the current blocking element 4, the drive signal being at high level normally and at low level upon detection of an anomaly such as overcurrent. In other words, the current blocking element 4 is turned off only when an anomaly is detected.

Also, the control circuit 130 generates a rectangular drive signal (hereinafter referred to as a pulse signal) for controlling the switching device 5. The switching device 5 turns on and off in response to this pulse signal. Note that separate control circuits may be provided: one for controlling on and off of the current blocking element 4 and one for controlling on and off of the switching device 5.

The switching device 5 is a test target of the turn-off SW test and is an IGBT here. Note that the switching device 5 is not limited to an IGBT and may be, for example, a MOSFET.

The collector electrode of the switching device 5 is coupled to the coil L1 via the terminal B and the current blocking element 4, and the emitter electrode of the switching device 5 is grounded via the terminal C. The gate electrode of the switching device 5 is coupled to the terminal A, and the above-described pulse signal is applied to the gate electrode of the switching device 5 via the resistor 150. The switching device 5 turns on when the pulse signal is at high level and off when the pulse signal is at low level.

Note that in the switching device 5 (IGBT), the gate and emitter electrodes are formed on the front surface of the switching device 5, and the collector electrode is formed on the back surface of the switching device 5.

The terminal B is coupled to a stage (not shown) of the testing apparatus 1A. Then, the terminal B is coupled to the collector electrode of the switching device 5 when the switching device 5 is placed on the stage.

The terminal A is coupled to a gate electrode probe (not shown) of the testing apparatus 1A. When this probe is brought into contact with the gate electrode on the front surface of the switching device 5, the terminal A is coupled to the gate electrode of the switching device 5.

The terminal C is coupled to an emitter electrode probe (not shown) of the testing apparatus 1A. When this probe is brought into contact with the emitter electrode on the front surface of the switching device 5, the terminal C is coupled to the emitter electrode of the switching device 5.

Then, the testing apparatus LA energizes the switching device 5 via the terminals A, B, C and performs electric characteristic evaluation (a turn-off SW test here).

<<Turn-Off SW Test>>

A turn-off SW test monitors a change in current or voltage upon application of a drive signal (a pulse signal) to the gate electrode of the switching device 5 via the resistor 150. In this event, when the switching device 5 is turned on and then off, a freewheeling path is formed as follows: the coil L1→the diode D1→the coil L1. Then, for example, if a back electromotive force voltage occurs when the switching device 5 is turned off, a majority of current flowing through the coil L1 now flows to that freewheeling path, and the energy stored at the coil L1 is consumed by a resistance component (not shown) of the coil L1.

Figure 2:
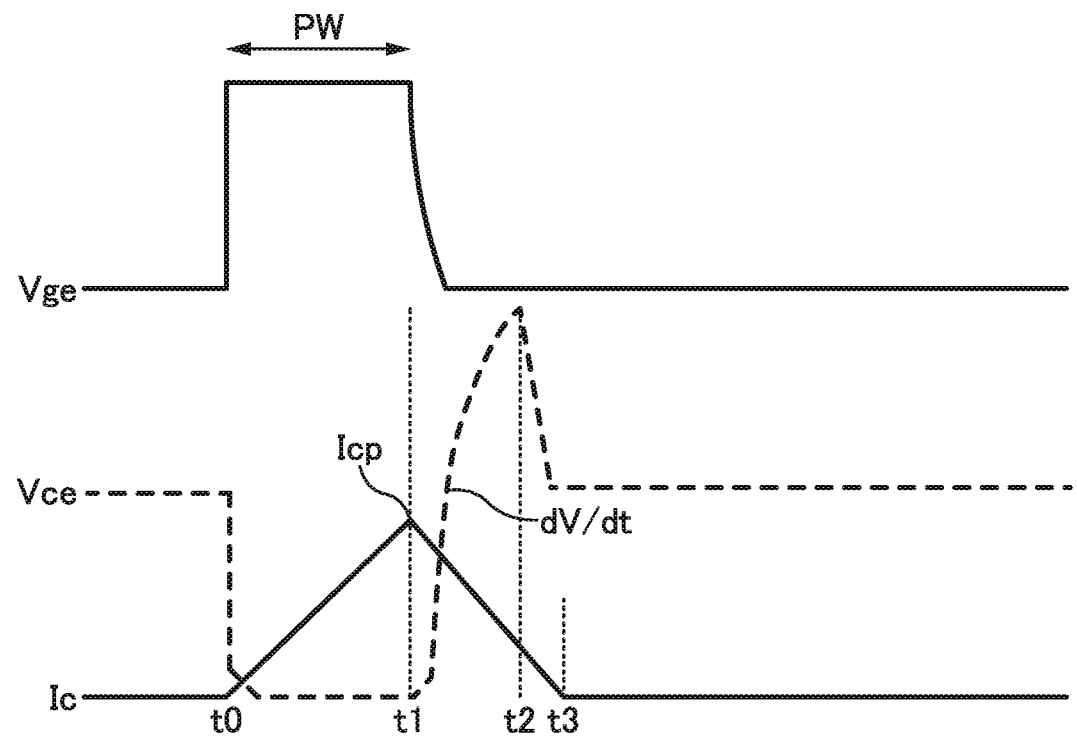
FIG. 2 is a diagram showing an example of waveforms of a turn-off SW test.

FIG. 2 is a diagram showing an example of the waveforms of a turn-off SW test. In FIG. 2, before time point t0, the switching device 5 is off.

At time point t0, the gate-emitter voltage (hereinafter referred to as a voltage Vge) exceeds a threshold (Vth) for the switching device 5, turning on the switching device 5. Meanwhile, the collector-emitter voltage (hereinafter referred to as a voltage Vce) becomes almost zero, increasing the collector current (hereinafter referred to as a current Ic). At time point t1, the switching device 5 turns off because the voltage Vge falls below the threshold (Vth). Also, at time point t1, the current Ic reaches a peak value Icp and then decreases after that. Also, the voltage Vce drastically increases starting at time point t1, reaches its maximum value at time point t2, and then at time point t3, returns to the same state as the state before time point t0. By performing a test of such waveforms, a detective product and the like can be screened out by providing damages to a defective portion by current concentration or latch-up.

Configuration parameters for the turn-off SW test that are especially important are the resistance value of the gate resistor (the resistor 150 here) of the switching device 5 and the pulse width PW of the pulse signal (the length of time to have the switching device 5 on).

Note that the voltage change rate of the voltage Vce (the voltage change amount per unit time: hereinafter referred to as dV/dt) upon turning off of the switching device 5 can be controlled by the setting of the resistance value of the gate resistor. Also, the peak value Icp of the current Ic can be controlled by the setting of the pulse width PW of the pulse signal.

<dV/dt>

Figure 3:
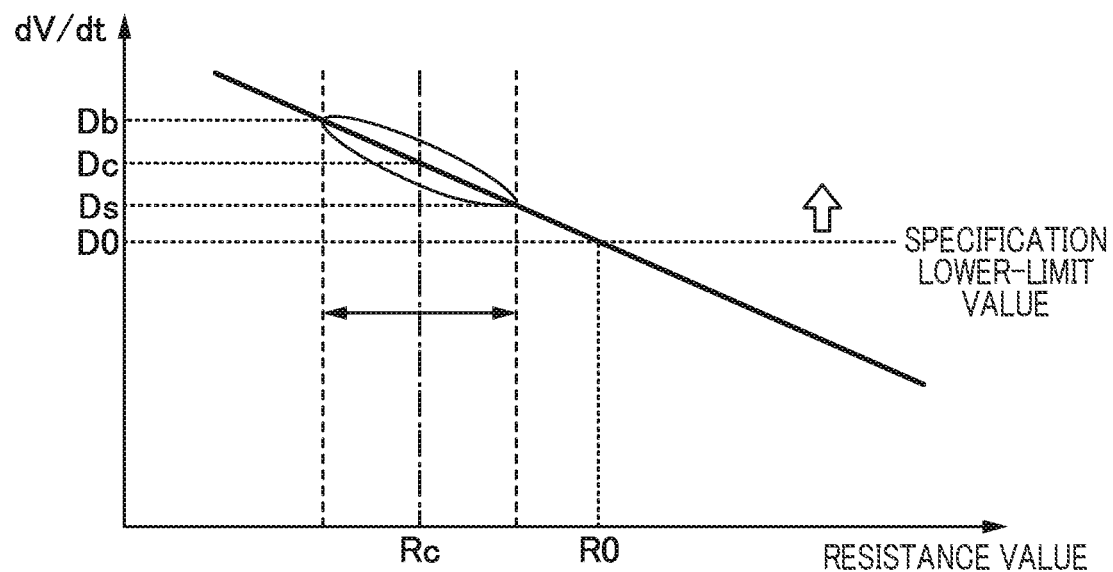
FIG. 3 is a diagram illustrating the relation between the resistance value of a gate resistor and dV/dt.

FIG. 3 is a diagram illustrating the relation between the resistance value of the gate resistor and the dV/dt. In FIG. 3, the horizontal axis represents the resistance value, and the vertical axis represents the dV/dt. FIG. 3 shows a dotted line indicating the lower-limit value of the dV/dt as defined by the specifications (standards). Note that a "specification lower-limit value" is the minimum value to fulfill the performance (the dV/dt here) required of the switching device 5. The performance falling below this value means that the specification is not met.

As shown in FIG. 3, the dV/dt is negatively correlated to the resistance value of the gate resistor: the larger the resistance value, the smaller the dV/dt.

FIG. 3 also has arrows showing the range of variability of the resistance value when the gate resistor is set to Rc (a range around the resistance value Rc being the center). Note that the variability includes, e.g., manufacturing variability of the resistor 150, variability among switching devices 5 (variability due to manufacturing), and variability of contact state or the like (variability due to measurement environments). The resistance value Rc is set so that the dV/dt corresponding to this range may not fall below the specification lower-limit value D0.

Specifically, the resistance value Rc is set so that a minimum value Ds of the arrowed range of the dV/dt may not fall below the specification lower-limit value D0. In other words, with the variability taken into consideration, the resistance value Rc of the resistor 150 is set to be sufficiently smaller than a resistance value R0 corresponding to the specification lower-limit value D0.

FIG. 3 also shows how the dV/dt is distributed (the substantially oval-shaped range) when the resistance value is set to Rc.

Figure 4:
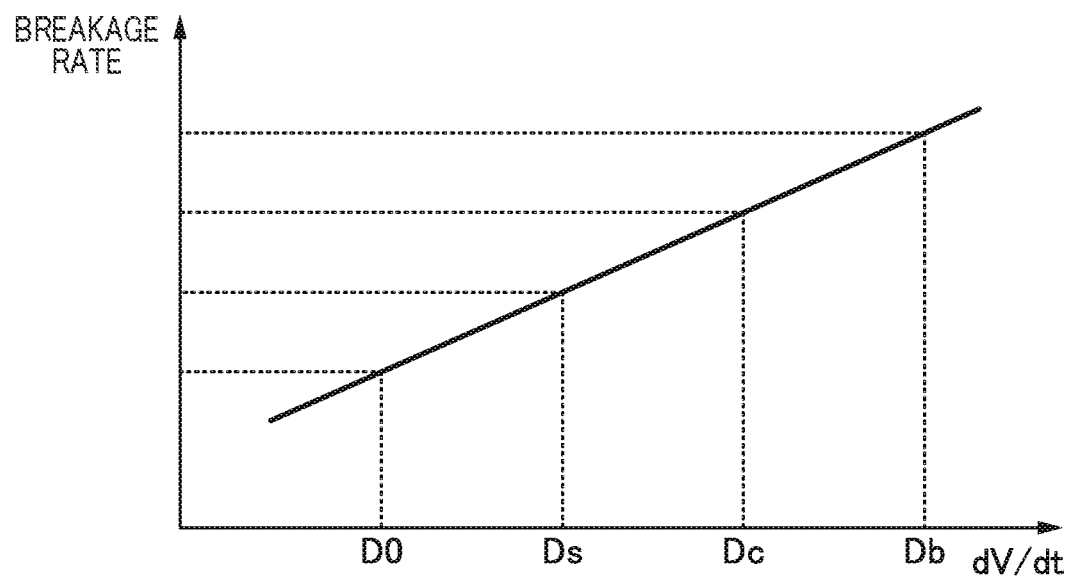
FIG. 4 is a diagram illustrating the relation between dV/dt and a breakage rate.

FIG. 4 is a diagram illustrating the relation between the dV/dt and a breakage rate. In FIG. 4, the horizontal axis represents the dV/dt, and the vertical axis represents the breakage rate. As shown in FIG. 4, the larger the dV/dt, the higher the breakage rate. In other words, the larger the dV/dt, the more likely it is that the switching device 5 breaks. Here, as shown in FIG. 3, a margin considering variability is set for the resistance value so that the dV/dt may not fall below the specification lower-limit value D0. Thus, there is a concern that the switching device 5 breaks excessively when the dV/dt becomes large like, for example, Dc to Db and consequently increases the breakage rate.

<Peak Value Icp>

Figure 5:
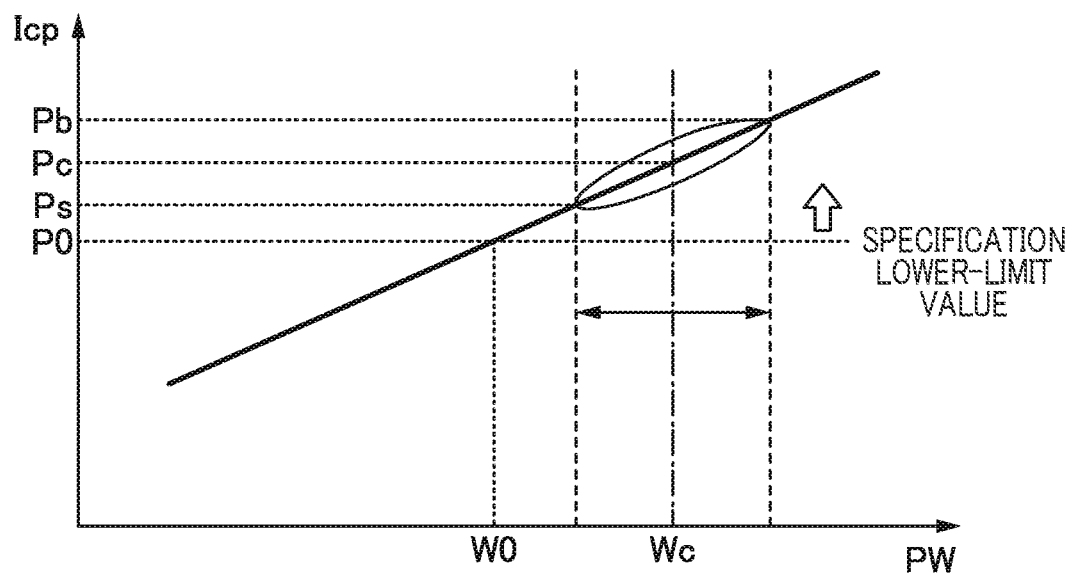
FIG. 5 is a diagram illustrating the relation between the pulse width PW of a drive signal (a pulse signal) and a peak value Icp of a current Ic.

FIG. 5 is a diagram illustrating the relation between the peak value Icp and the pulse width PW of the drive signal (the pulse signal). In FIG. 5, the horizontal axis represents the pulse width PW, and the vertical axis represents the peak value Icp. FIG. 5 also has a broken line indicating the lower-limit value of the peak value Icp as defined by the specifications (standards).

As shown in FIG. 5, the peak value Icp is positively correlated to the pulse width PW: the larger the pulse width PW (the longer the length), the larger the peak value Icp.

Also, like FIG. 3, FIG. 5 also has arrows showing the range of variability of the pulse width PW when the pulse width PW is set to a length Wc (the range around the length Wc being the center). The length Wc of the pulse width PW is set so that the peak value Icp corresponding to this range may not fall below a specification lower-limit value P0.

Specifically, the length Wc is set so that a minimum value Ps of the arrowed range of the peak value Icp may not fall below the specification lower-limit value P0. In this way, with the variability taken into consideration, the length Wc of the pulse width PW is set to be sufficiently longer than a length W0 corresponding to the specification lower-limit value P0. Note that the variability of the length Wc of the pulse width PW occurs due to, for example, the variability of an element (not shown) forming the control circuit 130.

FIG. 5 also shows how the peak value Icp is distributed (the substantially oval-shaped range) when the pulse width PW is set to the length Wc.

Figure 6:
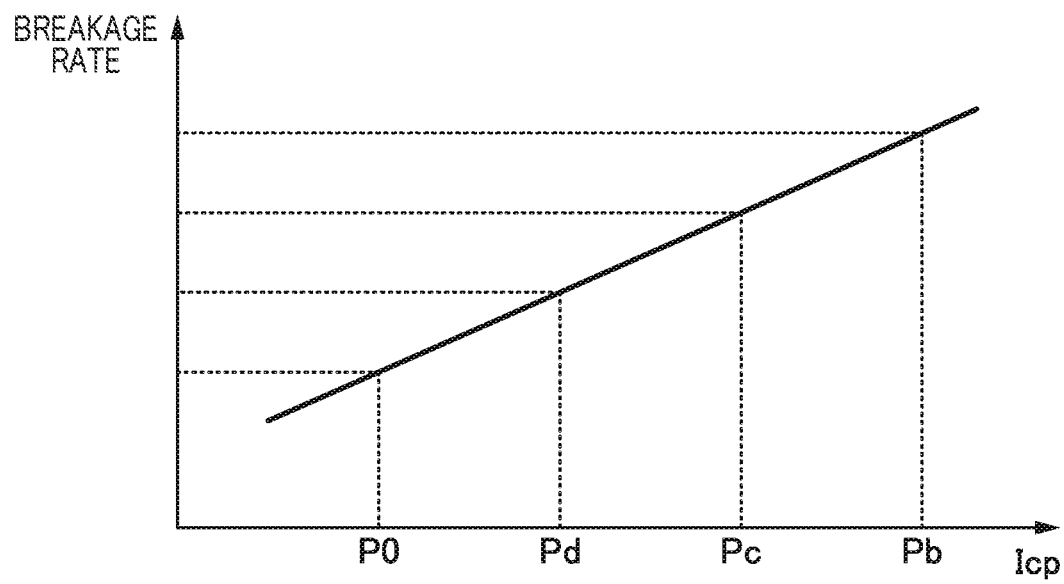
FIG. 6 is a diagram illustrating the relation between the peak value Icp and the breakage rate.

FIG. 6 is a diagram illustrating the relation between the peak value Icp and the breakage rate. In FIG. 6, the horizontal axis represents the peak value Icp, and the vertical axis represents the breakage rate. As shown in FIG. 6, the larger the peak value Icp, the higher the breakage rate. In other words, the larger the peak value Icp, the more likely it is that the switching device 5 breaks. Here, as shown in FIG. 5, a margin considering variability is set for the pulse width PW so that the peak value Icp may not fall below the specification lower-limit value P0 either. Thus, there is a concern that the switching device 5 may break excessively when the peak value Icp becomes large like, for example, Pc to Pb and consequently increases the breakage rate.

In view of the above, the present embodiment attempts to help prevent the switching device 5 from breaking excessively and reduce the breakage rate.

Present Embodiment

Figure 7:
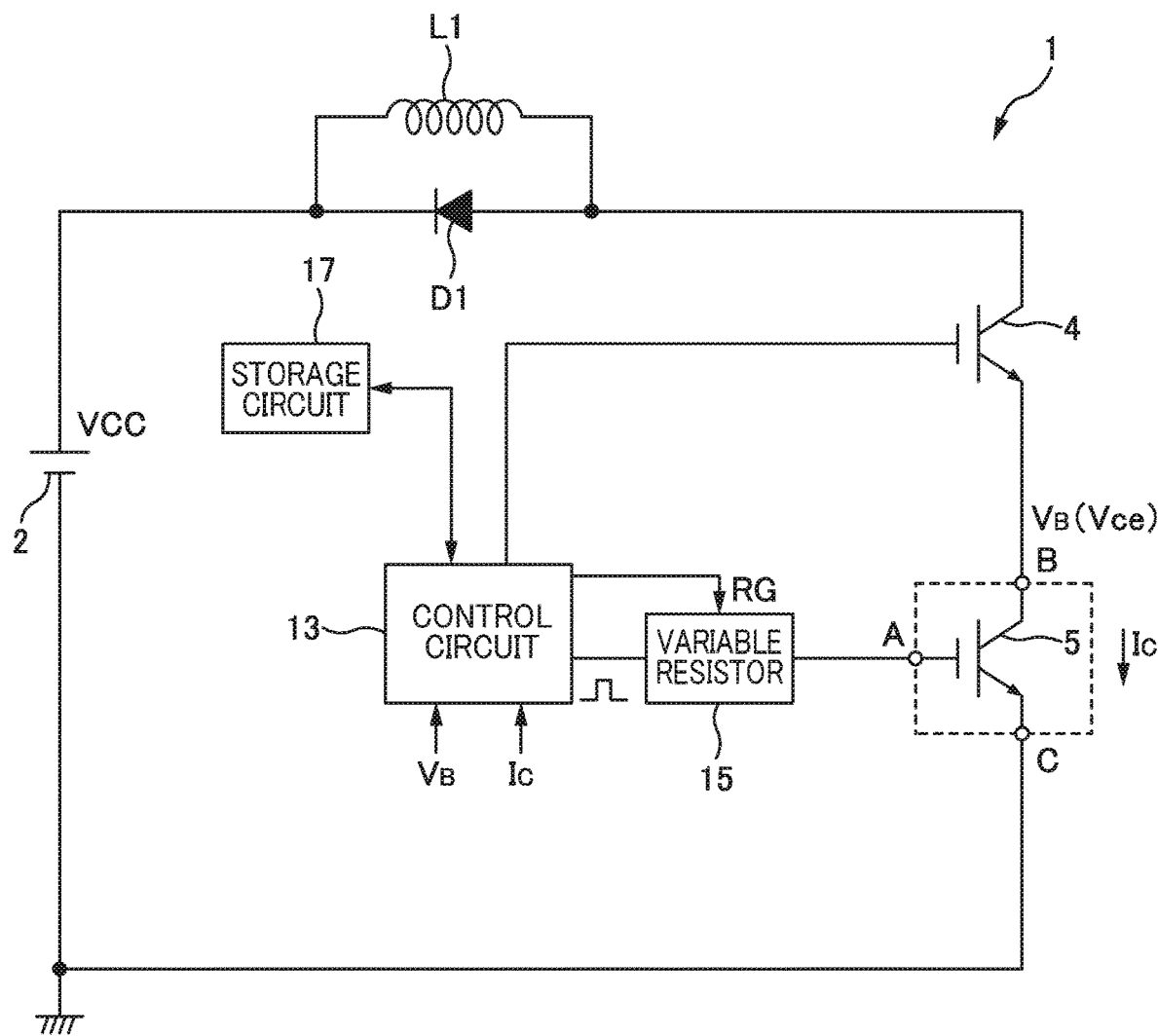
FIG. 7 is a diagram showing the configuration of a testing apparatus 1 of the present embodiment.

FIG. 7 is a diagram showing the configuration of a testing apparatus 1 of the present embodiment. The testing apparatus 1 of the present embodiment includes the power source 2, the coil L1, the diode D1, the current blocking element 4, a control circuit 13, a variable resistor 15, a storage circuit 17, and the terminals A, B, C, and is an apparatus for testing the switching device 5. Like the comparative example, the testing apparatus 1 also includes, e.g., a detection circuit (not shown) that detects an anomaly such as overcurrent by monitoring current values and voltage values during the test.

The power source 2, the coil L1, the diode D1, the current blocking element 4, and the terminals A, B, C are the same as those in the comparative example and are therefore not described here. Note that the coil L1 corresponds to the "inductor," and the power supply voltage VCC of the power source 2 corresponds to the "predetermined voltage." The diode D1 for current regeneration is provided in parallel to the coil L1.

The switching device 5 is an element to be tested and is series-coupled, via the current blocking element 4, to the coil L1 to which the power supply voltage VCC is applied. Note that the gate electrode of the switching device 5 corresponds to the "control electrode," the collector electrode thereof corresponds to the "power-source-side electrode," and the emitter electrode thereof corresponds to the "ground-side electrode."

The control circuit 13 of the present embodiment controls the variable resistor 15 and on and off of the switching device 5 and of the current blocking element 4. The control of the current blocking element 4 is the same as that in the comparative example and is therefore not described here.

The control circuit 13 of the present embodiment can change the pulse width PW of the drive signal (pulse signal) to be supplied to the switching device 5. The control circuit 13 can also change the resistance value of the variable resistor 15 by controlling on and off of switches SW1 to SW6 of the variable resistor 15 (to be described later).

Further, the control circuit 13 of the present embodiment monitors a voltage VB at the terminal B and a current flowing through the terminal B (the current Ic) and can obtain the dV/dt and the peak value Icp. The control circuit 13 also has a function to determine test results by comparing the characteristics (the dV/dt and the peak value Icp) obtained by the turn-off SW test with information stored in the storage circuit 17 (to be described later).

The variable resistor 15 is provided between the control circuit 13 and the gate electrode of the switching device 5 (or the terminal A to be more specific).

Figure 8:
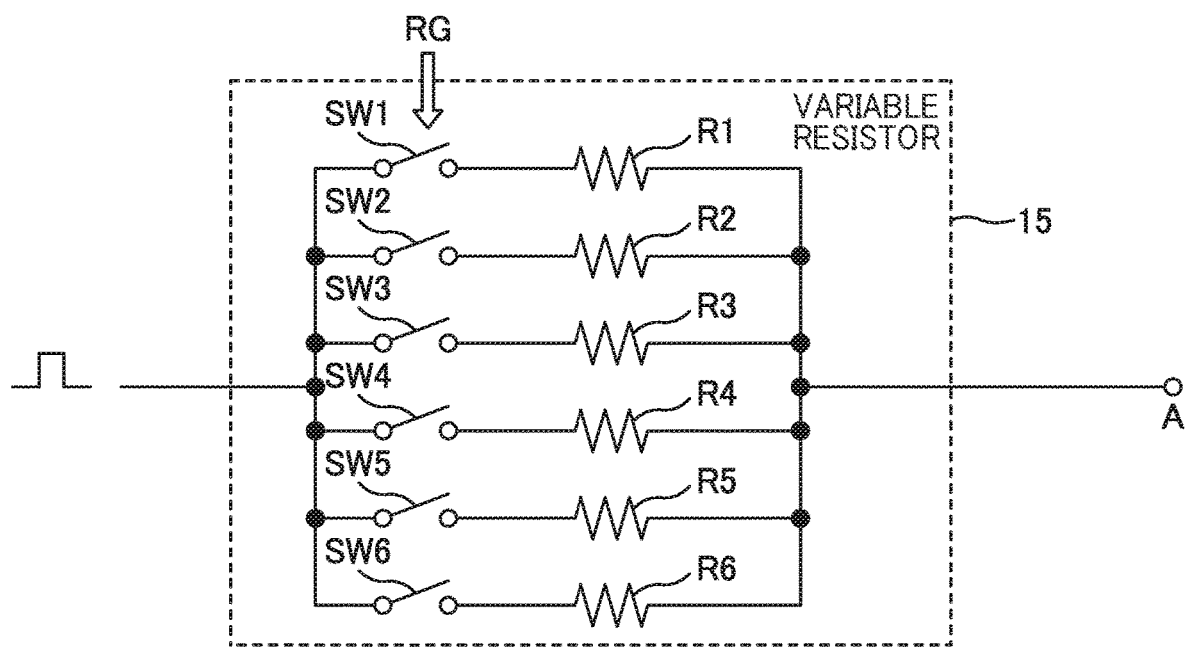
FIG. 8 is a diagram showing an example of the variable resistor 15.

FIG. 8 is a diagram showing an example of the variable resistor 15. The variable resistor 15 shown in FIG. 8 includes the switches SW1 to SW6 and resistors R1 to R6 having different resistance values from one another.

The switch SW1 is series-coupled to the resistor R1. Similarly, the switches SW2 to SW6 are series-coupled to the resistors R2 to R6, respectively. Then, the series-coupled combinations of the resistor and the switch are coupled in parallel.

The control circuit 13 outputs a signal RG for selectively turning on the switches SW1 to SW6. The switches SW1 to SW6 are selectively turned on by this signal RG, setting the resistance value of the variable resistor 15. Note that the number of switches to be turned on is not limited to one and may be more than one. Also, the variable resistor 15 is not limited to the configuration (such as the number of resistors and how they are coupled) shown in FIG. 8 as long as the resistance value is variable.

The storage circuit 17 stores information indicating the relation (the solid line in FIG. 3) between the dV/dt of the voltage Vce when the switching device 5 is turned off and the resistance value of the gate resistor (which is the variable resistor 15 here) (this information is hereinafter referred to as voltage information). The storage circuit 17 also stores information indicating the relation (the solid line in FIG. 5) between the peak value Icp of the current Ic and the pulse width PW of a pulse signal for turning on the switching device 5 (this information is hereinafter referred to as current information). The voltage information and the current information may be stored for each product, or may be rewritten for each product to be tested. Note that the voltage information corresponds to the "first information," and the current information corresponds to the "second information."

Figure 9:
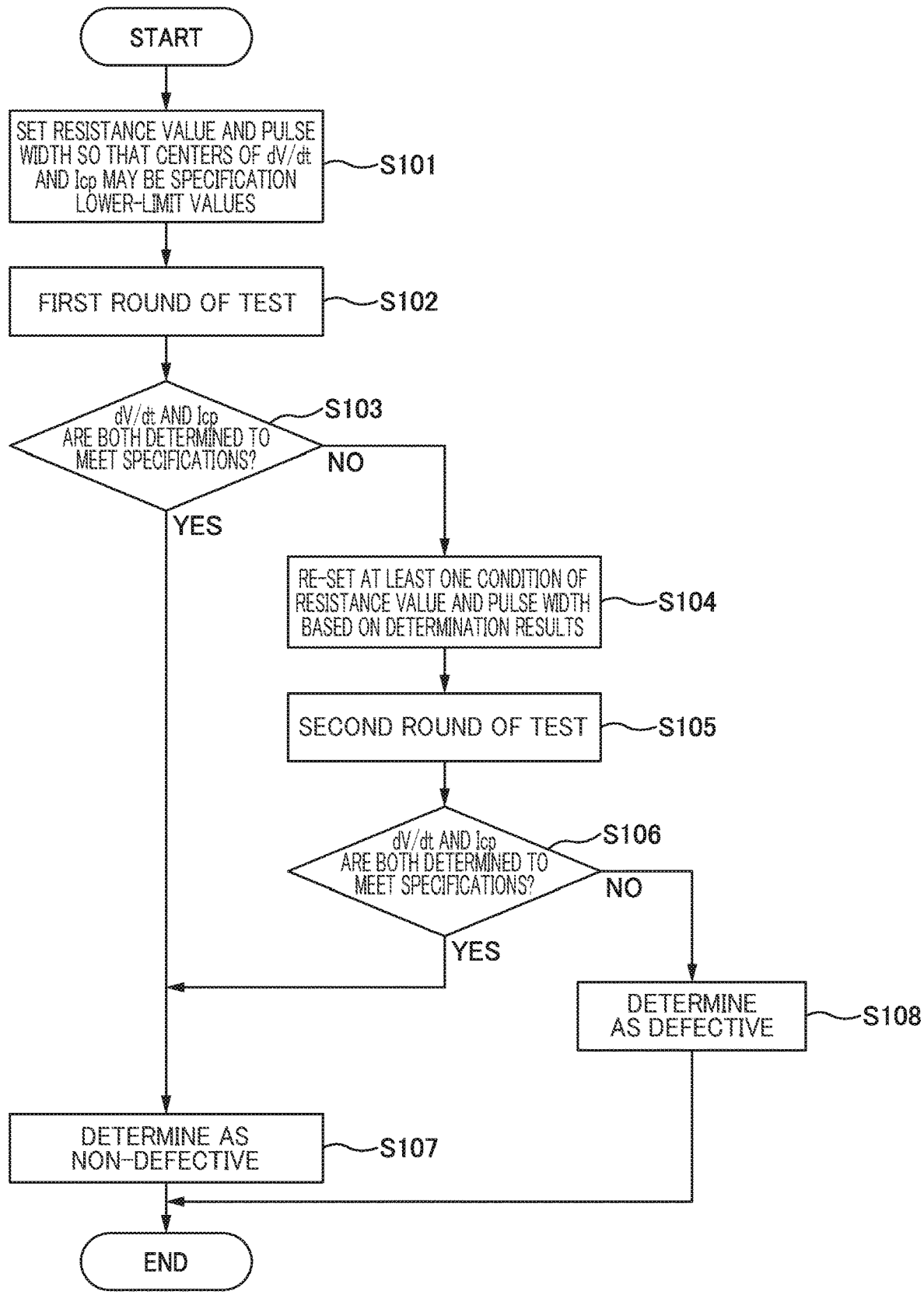
FIG. 9 is a flowchart of a turn-off switching test performed by the testing apparatus 1 of the present embodiment.

FIG. 9 is a flowchart of the turn-off SW test performed by the testing apparatus 1 of the present embodiment. Also, FIG. 10 is a diagram showing the relation between the resistance value and the dV/dt of the present embodiment, and FIG. 11 is a diagram showing the relation between the pulse width and the peak value Icp of the present embodiment.

The control circuit 13 of the present embodiment sets the resistance value and the pulse width PW based on the voltage information and the current information stored in the storage circuit 17 so that the centers of the dV/dt and the peak value Icp may be their respective specification lower-limit values (S101).

Figure 10:
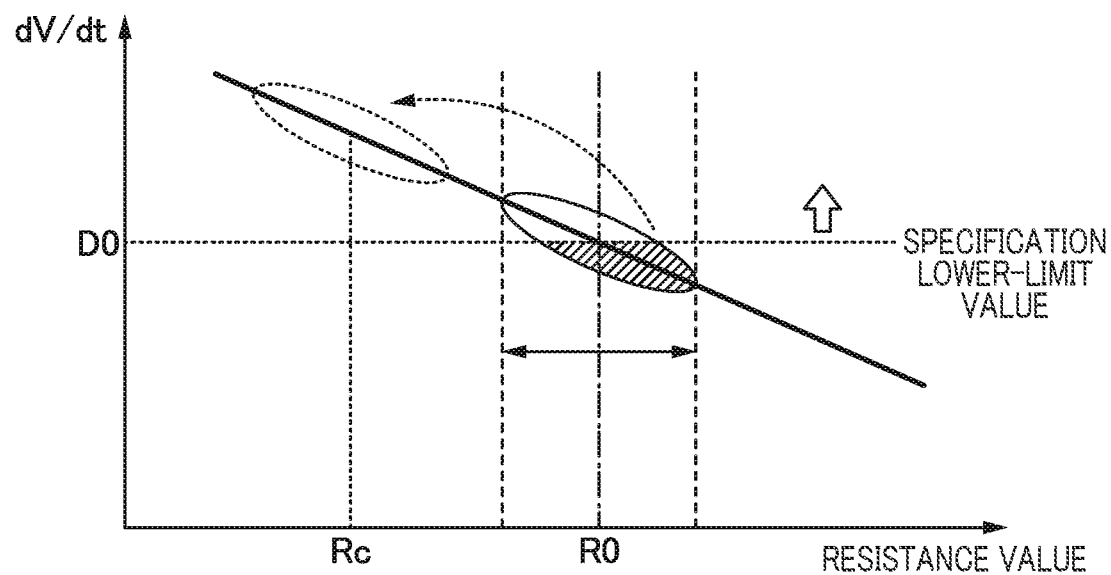
FIG. 10 is a diagram showing the relation between the resistance value and the dV/dt of the present embodiment.

For example, as shown in FIG. 10, the control circuit 13 sets the resistance value of the variable resistor 15 to R0, which corresponds to the specification lower-limit value D0 of the dV/dt. Note that the specification of the dV/dt corresponds to the "first specification," and the resistance value R0 set here corresponds to the "first resistance value."

Figure 11:
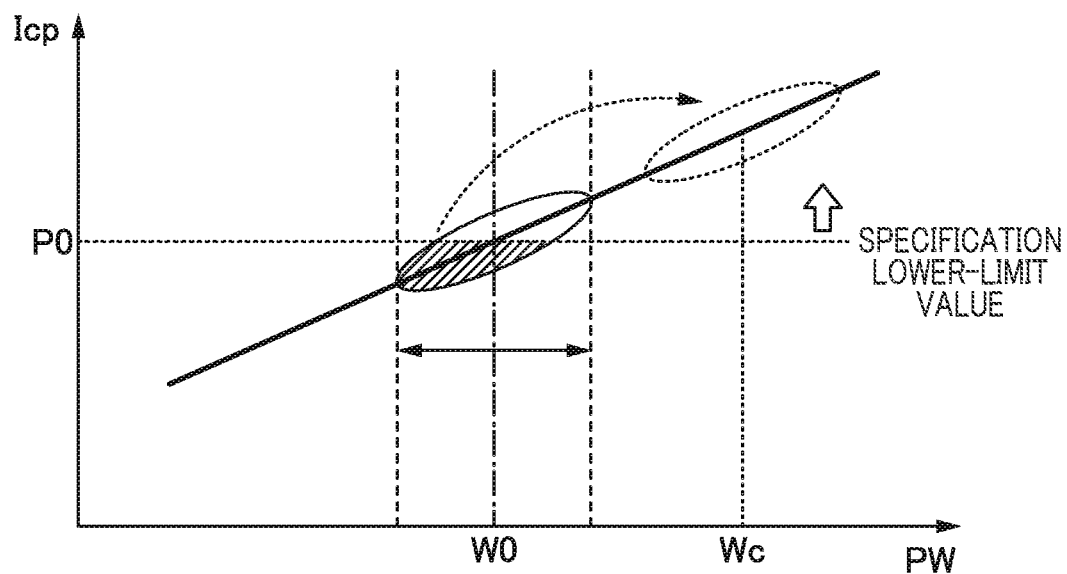
FIG. 11 is a diagram showing the relation between the pulse width and the peak value Icp of the present embodiment.

Also, as shown in FIG. 11, the control circuit 13 sets the pulse width PW of the pulse signal to a length W0, which corresponds to the specification lower-limit value P0 of the peak value Icp. Note that the specification of the peak value Icp corresponds to the "second specification," and the length W0 set here corresponds to the "first length."

Then, the control circuit 13 conducts the first round of the turn-off SW test (S102) and determines whether the dV/dt and the peak value Icp both meet their respective specifications (S103). The dV/dt and the peak value Icp that are obtained by this first round of the turn-off SW test correspond to the "first voltage change rate" and the "first peak value," respectively.

In the present embodiment, a margin considering variability is not set. Thus, in, for example, the hatched portions in FIGS. 10 and 11, the dV/dt and the peak value Icp fall below their specification lower-limit values and are determined as not meeting their specifications (NO). Meanwhile, when exceeding the lower-limit values, the dV/dt and the peak value Icp are determined as meeting their specifications (YES).

If not both of the dV/dt and the peak value Icp are determined "YES" (NO in S103), the control circuit 13 re-sets at least one condition of the resistance value of the variable resistor 15 and the pulse width PW of the pulse signal based on the first test results and the information stored in the storage circuit 17 (the voltage information and the current information) (S104).

For example, if the dV/dt is below the lower-limit value D0, the control circuit 13 sets the resistance value of the variable resistor 15 to a value smaller than R0 in accordance with the first test results. Here, even if there is variability, the control circuit 13 sets the resistance value of the variable resistor 15 to the resistance value Rc (see FIG. 3) which does not fall below the lower-limit value D0. Note that the resistance value of the variable resistor 15 may be set to, for example, a value between R0 and Rc in accordance with the first test results. The resistance value set for the variable resistor 15 here (for example, the resistance value Rc) corresponds to the "second resistance value."

Similarly, if the peak value Icp is below the lower-limit value P0, the control circuit 13 sets the length of the pulse width PW to a value longer than W0 in accordance with the first test results. Here, even if there is variability, the control circuit 13 sets the length of the pulse width PW to the length Wc (see FIG. 5) which does not fall below the lower-limit value P0. Note that the pulse width PW may be set to, for example, a value between the length W0 and the length Wc in accordance with the first test results. The length of the pulse width PW set here (for example, the length Wc) corresponds to the "second length."

Also, if both of the dV/dt and the peak value Icp are lower than their respective lower-limit values, the resistance value of the variable resistor 15 and the pulse width PW can both be re-set as described above.

Then, the control circuit 13 conducts the second round of the turn-off SW test (S105) and determines whether the dV/dt and the peak value Icp meet their respective specifications (S106). If the resistance value of the variable resistor 15 was changed, the dV/dt obtained by the second round of the turn-off SW test corresponds to the "second voltage change rate." Also, if the pulse width PW was changed, the peak value Icp obtained by the second round of the turn-off SW test corresponds to the "second peak value."

Note that in the present embodiment, the second round of the turn-off SW test is conducted under the same conditions (the measurement environment) as the first round of the turn-off SW test. Specifically, after the completion of the first round of test, the probes and the stage of the testing apparatus 1 are held in contact with the switching device 5. Then, right after the conditions are changed, the second round of the measurement is executed. This enables the second round of the test to be executed using the same measurement environment and the same device as those in the first round of the test.

If it is determined "YES" in Step S106 (YES in S106) or it is determined "YES" in Step S103 described earlier (YES in S103), the control circuit 13 determines that the switching device 5 is non-defective (S107).

Meanwhile, if it is determined "NO" in S106 (NO in S106), the control circuit 13 determines that the switching device 5 is defective (S108).

In this way, in the present embodiment, the first round of the turn-off SW test is performed by setting conditions (the resistance value and the pulse width PW) that are proper in relation to the specification lower-limit values of the switching device 5. Then, the second round of the test is performed after resetting the condition determined "NO" in the first round of the test in accordance with the first test results. This helps prevent the switching device 5 from receiving excessive stress and thus reduce the breakage rate.

Note that without the first determination (Step S103) performed, the second round of the test may be executed after the conditions for the second round are set based on the first test results.

The present invention can be applied to the manufacturing process of the switching device as follows.

First, the resistance value and the pulse width PW are set based on the voltage information and the current information corresponding to the product to be tested (S101).

Next, the first round of the turn-off SW test is conducted on a plurality of switching devices (S102), and it is determined, for each of the plurality of switching devices, whether the dV/dt and the peak value Icp meet their respective specifications (S103).

Next, for each of the switching devices determined in Step S103 that not both of the dV/dt and the peak value Icp meet the specifications, the resistance value of the variable resistor 15 and/or the pulse width PW of the pulse signal are re-set based on the first test results and the information stored in the storage circuit 17 (the voltage information and the current information) (S104).

Next, using the settings made in Step S104, the second round of the test is performed (S105) on each of the switching devices determined in Step S103 that not both of the dV/dt and the peak value Icp meet the specifications, and it is determined, for each of those switching devices, whether the dV/dt and the peak value Icp meet their respective specifications (S106).

Next, the switching device that is determined "YES" in Step S106 (YES in S106) or determined "YES" in S103 described above (YES in S103) is determined to be non-defective (S107). Meanwhile, the switching device that is determined "NO" in Step S106 (NO in S106) is determined to be defective (S108), and the test ends.

SUMMARY

The testing apparatus 1 as an embodiment of the present invention has been described above. The testing apparatus 1 is a testing apparatus that tests the switching device 5 series-coupled to the coil L1 to which the power supply voltage VCC is applied. The testing apparatus 1 includes the variable resistor 15 coupled to the gate electrode of the switching device 5, the storage circuit 17 that stores the voltage information indicating the relation between the dV/dt when the switching device 5 is turned off and the resistance of the variable resistor 15, and the control circuit 13 that controls the variable resistor 15 and on and off of the switching device 5. The control circuit 13 sets the resistance value of the variable resistor 15 to R0, obtains dV/dt, sets the resistance value of the variable resistor 15 to a value smaller than R0 (for example, Rc) based on the dV/dt and the voltage information stored in the storage circuit 17, and obtains dV/dt. The control circuit 13 then determines whether the dV/dt obtained meets the specification of the dV/dt of the switching device 5 (the first specification). This enables the breakage rate of the switching device 5 to be reduced compared to the comparative example.

Also, the control circuit 13 determines whether the dV/dt measured when the resistance value of the variable resistor 15 is R0 meets the specification, and if not, sets a resistance value of the variable resistor 15 to a resistance value smaller than the resistance value R0. Thus, if the specification is met in the first round, the second round of the test does not need to be executed (which is a test that applies more stress than the first round). This can lead to a lower breakage rate.

Also, the control circuit 13 sets a resistance value of the variable resistor 15 to the resistance value R0 so that the dV/dt may be the specification lower-limit value D0. This makes it more likely that it is determined "YES" in the first round.

Also, the storage circuit 17 stores the current information indicating the relation between the peak value Icp of the current Ic flowing through the switching device 5 when the switching device 5 is turned off and the pulse width PW of the pulse signal for turning on the switching device 5. Then, the control circuit 13 sets the pulse width PW to the length W0, obtains the peak value Icp, sets the pulse width PW to a length longer than the length W0 (for example, Wc) based on the peak value Icp and the current information, obtains the peak value Icp, and determines whether the peak value Icp meets the specification of the peak value Icp of the switching device 5. This enables the breakage rate of the switching device 5 to be low compared to the comparative example.

Also, the control circuit 13 determines whether the peak value Icp measured when the length of the pulse width PW is set to W0 meets the specification, and if the peak value Icp does not meet the specification, sets the pulse width PW to a length longer than the length W0. Thus, if the specification is met in the first round, the second round of the test does not need to be executed (which is a test that gives more stress than the first round). This can lead to a lower breakage rate.

Also, the control circuit 13 sets the length of the pulse width PW to W0 so that the peak value Icp may be the specification lower-limit value. This makes it more likely that it is determined "YES" in the first round.

Also, the diode D1 for current regeneration is provided in parallel with the coil L1. Thus, when the switching device 5 is turned off, a majority of the energy stored at the coil L1 flows to the freewheeling path formed by the coil L1 and the diode D1. This enables the energy to be consumed by a resistance component of the coil L1.

The present invention has been made in view of the problems in the prior art described above and aims to provide a testing apparatus and a testing method that can reduce the breakage rate of a switching device.

The present invention can provide a testing apparatus and a testing method that can reduce the breakage rate of a switching device.

Embodiments of the present disclosure described above are simply to facilitate understanding of the present disclosure and are not in any way to be construed as limiting the present disclosure. The present disclosure may variously be changed or altered without departing from its essential features and encompass equivalents thereof.

What is claimed is:

1. A testing apparatus for testing a switching device that is series-coupled to an inductor, and that has a control electrode, a power-source-side electrode, and a ground-side electrode, a predetermined voltage being applied to the inductor, the testing apparatus comprising:
a variable resistor coupled to the control electrode of the switching device;
a storage circuit configured to store first information indicating a relation between a resistance value of the variable resistor and a voltage change rate which is a rate at which a voltage between the power-source-side electrode and the ground-side electrode of the switching device changes when the switching device is turned off; and
a control circuit configured to control the variable resistor, and control on and off of the switching device, wherein the control circuit is configured to:
set the resistance value of the variable resistor to a first resistance value and obtain a first value of the voltage change rate,
set the resistance value of the variable resistor to a second resistance value smaller than the first resistance value based on the first value of voltage change rate and the first information,
obtain a second value of the voltage change rate measured when the variable resistor is of the second resistance value, and
determine whether the second value of the voltage change rate meets a first specification of the switching device.

2. The testing apparatus according to claim 1, wherein the control circuit
determines whether the first value of the voltage change rate meets the first specification, and
sets the resistance value of the variable resistor to the second resistance value when the first value of the voltage change rate does not meet the first specification.

3. The testing apparatus according to claim 1, wherein
the first specification has a specification lower-limit value, and
the control circuit sets the resistance value of the variable resistor to the first resistance value, so that the first value of the voltage change rate is the specification lower-limit value of the first specification.

4. The testing apparatus according to claim 1, wherein
the storage circuit further stores second information indicating a relation between
a peak value of a current flowing through the switching device when the switching device is turned off, and
a pulse width of a pulse signal for turning on the switching device, and
the control circuit is further configured to
set the pulse width to a first length and obtains a first peak value that is a first value of the peak value,
set the pulse width to a second length longer than the first length based on the first peak value and the second information,
obtains a second peak value that is a second value of the peak value measured when the pulse width is of the second length, and
determines whether the second peak value meets a second specification of the switching device.

5. The testing apparatus according to claim 4, wherein the control circuit
determines whether the first peak value meets the second specification, and
sets the pulse width to the second length when the first peak value does not meet the second specification.

6. The testing apparatus according to claim 4, wherein
the second specification has a specification lower-limit value, and
the control circuit sets the pulse width to the first length so that the first peak value is the specification lower-limit value of the second specification.

7. The testing apparatus according to claim 1, further comprising:
a diode for current regeneration provided in parallel with the inductor.

8. A testing method for testing a switching device that is series-coupled to an inductor, and has a control electrode, a power-source-side electrode, and a ground-side electrode, a predetermined voltage being applied to the inductor, the testing method comprising:
setting a resistance value of the variable resistor coupled to a control electrode of the switching device to a first resistance value and obtaining a first value of a voltage change rate, the voltage change rate being a rate at which a voltage between the power-source-side electrode and the ground-side electrode of the switching device changes when the switching device is turned off,
setting the resistance value of the variable resistor to a second resistance value smaller than the first resistance value based on the first value of the voltage change rate and first information indicating a relation between a resistance value of the variable resistor and the voltage change rate,
obtaining a second value of the voltage change rate, when the variable resistor is of the second resistance value, and
determining whether the second value of the voltage change rate meets a first specification of the switching device.

9. The testing method according to claim 8, comprising:
determining whether the first value of the voltage change rate meets the first specification, and
setting the resistance value of the variable resistor to the second resistance value when the first value of the voltage change rate does not meet the first specification.

10. The testing method according to claim 8, wherein
the first specification has a specification lower-limit value, and
the testing method further includes setting the resistance value of the variable resistor to the first resistance value so that the first value of the voltage change rate is the specification lower-limit value of the first specification.

11. The testing method according to claim 8, further comprising:
setting a pulse width of a pulse signal for turning on the switching device to a first length, and obtaining a first peak value, which is a first value of a peak value of a current flowing through the switching device when the switching device is turned off;
obtaining second information indicating a relation between the pulse width and the peak value of the current flowing through the switching device when the switching device is turned off; and setting the pulse width to a second length longer than the first length based on the first peak value and the second information, obtaining a second peak value, which is a second value of the peak value measured when the pulse width is of the second length, and determining whether the second peak value meets a second specification of the switching device.

12. The testing method according to claim 11, comprising:

determining whether the first peak value meets the second specification, and setting the pulse width to the second length when the first peak value does not meet the second specification.

13. The testing method according to claim 11, wherein the second specification has a specification lower-limit value, and the testing method further includes setting the pulse width to the first length so that the first peak value is the specification lower-limit value of the second specification.

14. The testing method according to claim 8, further comprising:

providing a diode for current regeneration in parallel with the inductor.

* * * * *